(12) United States Patent
Monfray et al.

(10) Patent No.: US 7,436,005 B2
(45) Date of Patent: Oct. 14, 2008

(54) PROCESS FOR FABRICATING A HETEROSTRUCTURE-CHANNEL INSULATED-GATE FIELD-EFFECT TRANSISTOR, AND THE CORRESPONDING TRANSISTOR

(75) Inventors: Stéphane Monfray, Grenoble (FR); Stéphan Borel, Saint-Martin d' Heres (FR); Thomas Skotnicki, Crolles (FR)

(73) Assignees: STMicroelectronics (Crolles 2) SAS, Crolles (FR); Commissariat a l'Energie Atomique, Paris (FR)

( * ) Notice: Subject to any disclaimer, the term of this patent is extended or adjusted under 35 U.S.C. 154(b) by 133 days.

(21) Appl. No.: 11/227,681

(22) Filed: Sep. 15, 2005

(65) Prior Publication Data

US 2006/0081876 A1 Apr. 20, 2006

(30) Foreign Application Priority Data

Sep. 15, 2004 (FR) .................................. 04 09749

(51) Int. Cl.
*H01L 29/94* (2006.01)
(52) U.S. Cl. ....................................... 257/192; 257/183
(58) Field of Classification Search ................ 257/192; 438/285, 590
See application file for complete search history.

(56) References Cited

U.S. PATENT DOCUMENTS

| 6,555,839 | B2 * | 4/2003 | Fitzgerald | 257/18 |
| 6,989,570 | B2 * | 1/2006 | Skotnicki et al. | 257/347 |
| 2002/0089003 | A1 * | 7/2002 | Lee | 257/288 |

FOREIGN PATENT DOCUMENTS

FR 2 838 237 10/2003

OTHER PUBLICATIONS

Tezuka et al.; "Novel Fully-Depleted SiGe-on-Insulator pMOSFETs with High-Mobility SiGe Surface Channels", IEDM Technical Digest, Washington DC, Dec. 2-5, 2001, pp. 3361-3363, XP010575278.
Lee et al., "Performance Enhancement on Sub-70nm Strained Silicon SOI MOSFETs on Ultra-thin Thermally Mixed Strained Silicon/SiGe on Insulator (TM-SGOI) Substrate with Raised S/D"; IEDM Technical Digest, San Francisco, CA, Dec. 8-11, 2002, New York, NY, pp. 946-948; XP010626195.
Skotnicki, "Silicon on Nothing(SON)—Fabrication, Material and Devices"; Electrochemical Society Proceedings, New Jersey, US; vol. 2001, No. 3 dated Mar. 25, 2001, pp. 391-402; XP008014133.
Yee-Chia et al., "Enhanced Performance in Sub-100nm CMOSFETs Using Strained Epitaxial Silicon-Germanium", Electron Devices Meeting, Dec. 10-13, 2000, Piscataway, New Jersey, USA; pp. 753-756; XP010531871.

* cited by examiner

*Primary Examiner*—Jerome Jackson
*Assistant Examiner*—Anthony Ho
(74) *Attorney, Agent, or Firm*—Lisa K. Jorgenson; Allen, Dyer, Doppelt, Milbrath & Gilchrist

(57) ABSTRACT

The insulated-gate field-effect transistor includes a substrate surmounted by a layer of silicon-germanium alloy, the ratio of the germanium concentration to the silicon concentration of which increases towards the surface of the substrate. The transistor is formed on the active zone in the silicon-germanium alloy layer and lies between two isolating zones. The transistor includes a narrow heterostructure strained-semiconductor channel including a SiGe alloy layer in compression and a silicon layer in tension, extending between the gate and a dielectric block buried in the substrate.

22 Claims, 1 Drawing Sheet

PROCESS FOR FABRICATING A HETEROSTRUCTURE-CHANNEL INSULATED-GATE FIELD-EFFECT TRANSISTOR, AND THE CORRESPONDING TRANSISTOR

FIELD OF THE INVENTION

The present invention relates to integrated circuits, more particularly, to the production of heterostructure-channel transistors within integrated circuits.

BACKGROUND OF THE INVENTION

Si/SiGe heterostructure semiconductor channel transistors produced directly in a bulk substrate are known. However, such transistors have the drawback of exhibiting SCEs (Short Channel Effects) and DIBL (Drain-Induced Barrier Lowering). More precisely, when the length of the transistor gate decreases, the potential at the center of the channel is greatly modified and therefore the threshold voltage of the transistor will be changed, since the potential barrier between the source and the drain is lowered. This is the SCE effect. To this is added the action of the drain potential, which will further lower the potential barrier, i.e. the DIBL effect.

SUMMARY OF THE INVENTION

An object of the invention is to provide a transistor that offers better carrier mobility in the channel, while overcoming the SCE and DIBL effects, despite buried conduction of the carriers.

Another object of the present invention is to increase the conduction of electrons across a layer of strained silicon in tension in nMOS devices.

Another object of the present invention is to increase the conduction of holes across layers of strained silicon and silicon-germanium in compression in pMOS devices.

The present invention therefore provides a process for fabricating an insulated-gate field-effect transistor and includes: the deposition, on an active zone of a substrate, of a layer made of a material that can be removed selectively with respect to the material constituting the active zone; the formation of a narrow heterostructure strained-semiconductor channel on the layer of selectively removable material; the formation of an insulated gate on the channel; the selective removal of the layer of selectively removable material so as to create a cavity under the channel; the deposition of a dielectric material in the cavity so as to create a dielectric block; and the formation, from the active zone of the substrate, of a source region and a drain region extending on either side and in contact with the channel, the dielectric block then being buried beneath the channel.

By combining a narrow heterostructure strained-semiconductor channel with a buried dielectric beneath the channel and by delimiting the latter, better mobility of the carriers in the channel is obtained, while overcoming the problems of transistors of the prior art, i.e. the short channel and DIBL effects. A person skilled in the art will know how to choose the channel thickness to obtain a thin channel. As an indication, the thickness of such a channel is advantageously less than 10 nm.

According to one method of implementing the invention, the active zone of the substrate comprises a silicon-germanium alloy, the ratio of the germanium concentration to the silicon concentration of which increases towards the surface of the substrate and the layer made of a selectively removable material is a strained-silicon layer obtained by epitaxy from the upper surface of the active zone of the substrate. For example, it is possible to form the channel by epitaxially growing a first layer of silicon-germanium alloy on the strained-silicon layer so as to obtain a layer of silicon-germanium alloy in compression and by epitaxially growing a second layer of silicon on the said first layer so as to obtain strained silicon in tension. According to one method of implementing the invention, the source and drain regions are formed by epitaxial growth of a material comprising silicon.

The invention also provides an insulated-gate field-effect transistor comprising a narrow heterostructure semiconductor channel with a thickness comprised between 1 and 10 nm, comprising a layer of silicon-germanium alloy and a strained silicon layer located between the gate and a dielectric laid on the active zone of the substrate. According to one embodiment, the thickness of the strained silicon layer is comprised between 1 and 5 nm.

BRIEF DESCRIPTION OF THE DRAWINGS

Other advantages and features of the invention will become apparent on examining the detailed description of entirely non-limiting methods of implementation and embodiments, and the appended drawings in which.

DETAILED DESCRIPTION OF THE PREFERRED EMBODIMENTS

Figure 1:
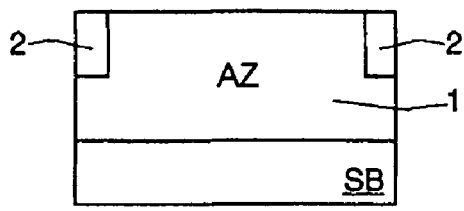
FIGS. 1 to 7 are cross-sectional views schematically illustrating steps of a method of fabricating an insulated-gate field-effect transistor according to the present invention.

The basic steps of one method of implementing the process according to the invention will now be described in greater detail. In FIG. 1, a layer 1 of a silicon-germanium alloy is formed by epitaxy on a substrate SB, for example made of silicon, the ratio of the germanium concentration to the silicon concentration of which alloy increases towards the surface of the substrate SB. The silicon and the germanium making up the alloy correspond to the formula $Si_{1-x}GE_x$, where x varies for example from 0 to 0.2 going towards the surface of the substrate (SB).

An active zone AZ is formed in this layer 1 between two isolating zones 2, the isolating zones possibly being isolating trenches. These isolating trenches may for example be deep trenches of the DTI (Deep Trench Isolation) type or shallow of the STI (Shallow Trench Isolation) type.

Figure 2:
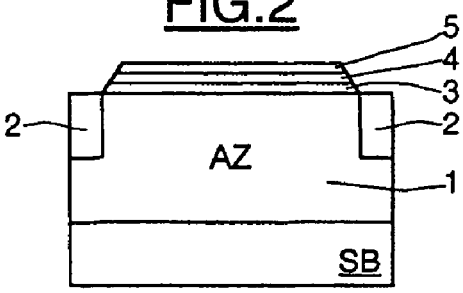

A silicon layer 3 is grown by selective epitaxy on the active zone AZ (FIG. 2), the silicon being strained because of the lattice mismatch between the crystal lattice of the silicon of the layer 3 and that of the SiGe alloy of the active zone AZ. As an indication, the thickness of the layer 3 may be 15 nm, but more generally it is between 10 nm and 40 nm.

A layer 4 of a strained silicon-germanium alloy in compression is formed in a similar manner, by selective epitaxy, on the layer 3. In this regard, the percentage of germanium in the layer 4 is chosen to be greater than the percentage of germanium in the active zone AZ. The thickness of the layer 4 may for example be 3 nm, but more generally it is between 1 nm and 5 nm. A layer 5 of strained silicon in tension is then formed by selective epitaxy on the layer 4. The thickness of the layer 5 may for example be 3 nm, but more generally it is between 1 nm and 5 nm.

Figure 3:
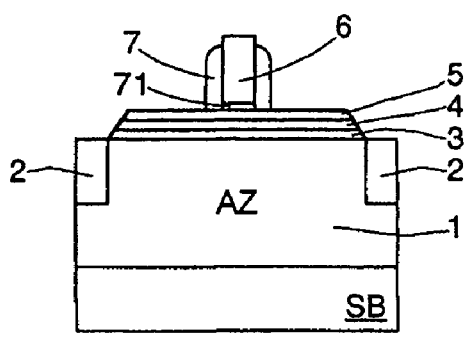

Next, a gate region 6, which may be made of polysilicon, is formed by known techniques. This gate region 6 is surrounded by spacers 7 (FIG. 3) and is separated from the layer 5 of silicon in tension by a layer 71 of silicon oxide (the gate oxide).

Figure 4:
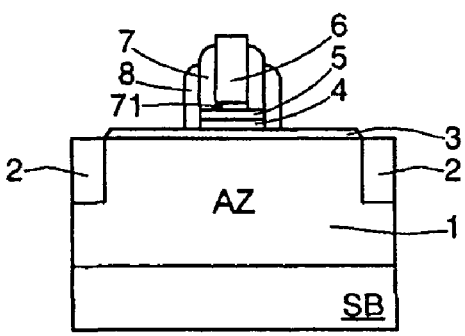

In FIG. 4, the layers 4 and 5, of silicon-germanium alloy in compression and of strained silicon in tension respectively, are etched by known means, for example by anisotropic etching, using the gate region 6 and the spacers 7 as masks. Additional spacers 8 are formed on either side of the spacers 7 and the layers 4 and 5—the spacers will subsequently serve as masks.

Figure 5:
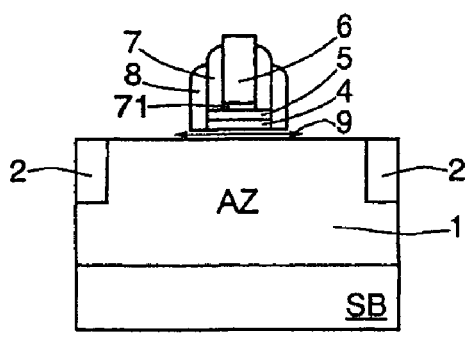

The layer 3 of strained silicon is then removed (FIG. 5), thus leaving in place a cavity 9 between the layer 4 of SiGe alloy in compression and the surface of the active zone AZ. This removal operation is carried out by known means, for example by selective isotropic plasma etching using a plasma of the ($CF_4$, $CH_2F_2$, $N_2$, $O_2$) type. The pressure and temperature conditions will be adjusted by a person skilled in the art so as to obtain the desired etch rate. The etching may for example be carried out at 25° C. and at atmospheric pressure.

Figure 6:
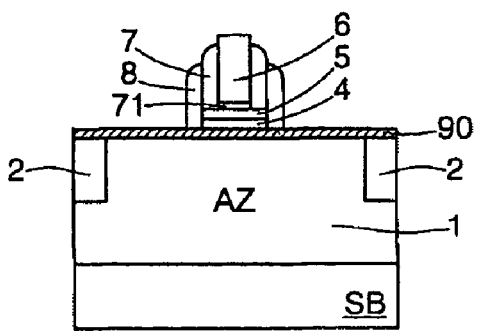
Figure 7:
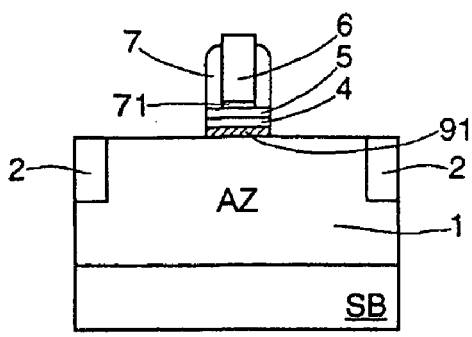

Next, a layer 90 of a dielectric (for example $SiO_2$) is deposited on the surface of the active zone AZ and in the cavity 9 (FIG. 6). The dielectric layer 90 is etched (FIG. 7) by known means, for example by anisotropic etching, using the spacers 8 as masks. Semiconductor zones 10 and 11 are formed (FIG. 8) by selective epitaxy on either side of the transistor, starting from the active zone AZ up to a point level with the surface of the layer 5 of strained silicon in tension. Implantation of a dopant is then carried out in these zones 10 and 11 in order to form the source and drain regions.

The dielectric block 91, now buried in the substrate, has a thickness identical to the initial layer 3 of strained silicon, that is to say typically 15 nm, but more generally between for example 10 nm and 40 nm.

Figure 8:
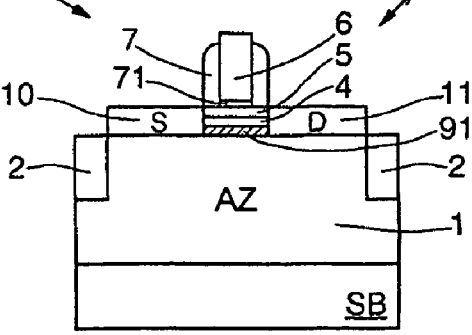
FIG. 8 is a cross-sectional view schematically showing an insulated-gate field-effect transistor according to the present invention within an integrated circuit.

FIG. 8 therefore shows an integrated circuit IC comprising an insulated-gate field-effect transistor T according to the invention. The integrated circuit comprises a substrate SB surmounted by a layer 1 of silicon-germanium alloy, the ratio of the germanium concentration to the silicon concentration of which increases towards the surface of the substrate (SB). The transistor T is formed on the active zone AZ in the layer 1 and lies between two isolating zones 2. The transistor includes a narrow heterostructure strained-semiconductor channel consisting of a layer 4 of SiGe alloy in compression and a layer 5 of silicon in tension, extending between the gate 6 and a dielectric block 91 buried in the substrate SB.

That which is claimed is:

1. A method for fabricating an insulated-gate field-effect transistor, the method comprising:
    forming an active zone on a substrate;
    depositing, on the active zone, a selectively removable material layer which is selectively removable with respect to the active zone;
    forming a heterostructure strained-semiconductor channel on the selectively removable material layer;
    forming an insulated gate on the channel;
    selectively removing the selectively removable material layer to create a cavity under the channel;
    depositing a dielectric material in the cavity to create a dielectric block beneath the channel; and
    forming a source region and a drain region extending on either side and in contact with the channel.

2. The method according to claim 1, wherein the thickness of the channel is less than 10 nm.

3. The method according to claim 1, wherein the active zone comprises a silicon-germanium alloy, the ratio of the germanium concentration to the silicon concentration of which increases towards a surface of the substrate; and wherein depositing the selectively removable material layer comprises forming a strained-silicon layer via selective epitaxy from an upper surface of the active zone.

4. The method according to claim 3, wherein forming the channel comprises:
    epitaxially growing a first layer of silicon-germanium alloy on the strained-silicon layer to obtain a compressed silicon-germanium alloy layer; and
    epitaxially growing a second layer of silicon on the first layer to obtain a tensioned strained silicon layer.

5. The method according to claim 1, wherein forming the source and drain regions comprises epitaxial growth of a silicon material.

6. The method according to claim 1, wherein forming the source and drain regions comprises epitaxial growth of a silicon material.

7. A method for fabricating a transistor, the method comprising:
    forming an active zone on a substrate;
    forming a strained-silicon layer on the active zone;
    forming a heterostructure strained-semiconductor channel on the strained-silicon layer;
    forming a gate on the channel;
    removing the strained-silicon layer under the channel;
    forming a dielectric block beneath the channel; and
    forming a source region and a drain region adjacent the channel.

8. The method according to claim 7, wherein the thickness of the channel is less than 10 nm.

9. The method according to claim 7, wherein the active zone comprises a silicon-germanium alloy, the ratio of the germanium concentration to the silicon concentration of which increases towards a surface of the substrate; and wherein forming the strained-silicon layer comprises selective epitaxy from an upper surface of the active zone.

10. The method according to claim 7, wherein forming the channel comprises:
    epitaxially growing a first layer of silicon-germanium alloy on the strained-silicon layer to obtain a compressed silicon-germanium alloy layer; and
    epitaxially growing a second layer of silicon on the first layer to obtain a tensioned strained silicon layer.

11. An integrated circuit comprising:
    a substrate;
    an active zone on the substrate and comprising silicon-germanium alloy, a ratio of germanium-to-silicon concentration increasing towards a surface of the substrate; and
    an insulated gate field-effect transistor including
        a dielectric block on the active zone,
        a gate above the dielectric block,
        a heterostructure semiconductor channel having a thickness between 1 and 10 nm, and including a silicon-germanium alloy layer and a strained-silicon layer between the gate and the dielectric block, and
        source and drain regions adjacent the channel.

12. The integrated circuit according to claim 11, wherein the strained-silicon layer has a thickness between 1 and 5 nm.

13. The integrated circuit according to claim 11, wherein the silicon-germanium alloy layer comprises a compressed silicon-germanium alloy layer; and wherein the strained-silicon comprises a tensioned strained silicon layer.

14. The integrated circuit according to claim 11, wherein the source and drain regions comprise a silicon material.

15. An integrated circuit comprising:
a substrate;
an active zone on the substrate and comprising silicon-germanium alloy, a ratio of germanium-to-silicon concentration increasing towards a surface of the substrate; and
an insulated gate field-effect transistor including
a dielectric block on the active zone,
a gate above the dielectric block,
a heterostructure semiconductor channel including a silicon-germanium alloy layer and a strained-silicon layer between the gate and the dielectric block, and
source and drain regions adjacent the channel.

16. The integrated circuit according to claim 15, wherein the strained-silicon layer has a thickness between 1 and 5 nm.

17. The integrated circuit according to claim 15, wherein the silicon-germanium alloy layer comprises a compressed silicon-germanium alloy layer; and wherein the strained-silicon comprises a tensioned strained silicon layer.

18. The integrated circuit according to claim 15, wherein the source and drain regions comprise a silicon material.

19. An integrated circuit comprising:
a substrate;
an active zone on the substrate; and
an insulated gate field-effect transistor including
a dielectric block on the active zone,
a gate above the dielectric block,
a heterostructure semiconductor channel having a thickness between 1 and 10 nm, and including a compressed silicon-germanium alloy layer and a tensioned strained-silicon layer between the gate and the dielectric block, and
source and drain regions adjacent the channel.

20. The integrated circuit according to claim 19, wherein the tensioned strained-silicon layer has a thickness between 1 and 5 nm.

21. An integrated circuit comprising:
a substrate;
an active zone on the substrate; and
an insulated gate field-effect transistor including
a dielectric block on the active zone,
a gate above the dielectric block,
a heterostructure semiconductor channel including a compressed silicon-germanium alloy layer and a tensioned strained-silicon layer between the gate and the dielectric block, and
source and drain regions adjacent the channel.

22. The integrated circuit according to claim 21, wherein the tensioned strained-silicon layer has a thickness between 1 and 5 nm.

* * * * *